US012601059B2

(12) United States Patent
Sakai et al.

(10) Patent No.: US 12,601,059 B2
(45) Date of Patent: Apr. 14, 2026

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Yunosuke Sakai, Toyama (JP); Takashi Ozaki, Toyama (JP); Keigo Nishida, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 766 days.

(21) Appl. No.: 17/860,573

(22) Filed: Jul. 8, 2022

(65) Prior Publication Data

US 2022/0341041 A1 Oct. 27, 2022

Related U.S. Application Data

(63) Continuation of application No. PCT/JP2020/012340, filed on Mar. 19, 2020.

(51) Int. Cl.
*C23C 16/455* (2006.01)
*C23C 16/44* (2006.01)
*C23C 16/458* (2006.01)

(52) U.S. Cl.
CPC .... *C23C 16/45578* (2013.01); *C23C 16/4412* (2013.01); *C23C 16/45506* (2013.01);
(Continued)

(58) Field of Classification Search
CPC .......... C23C 16/45578; C23C 16/4412; C23C 16/45506; C23C 16/45517;
(Continued)

(56) References Cited

U.S. PATENT DOCUMENTS

2009/0148704 A1* 6/2009 Takasuka .............. C30B 25/165
428/411.1
2010/0218724 A1* 9/2010 Okada ................. C23C 16/4405
118/724
(Continued)

FOREIGN PATENT DOCUMENTS

CN 107818911 A 3/2018
CN 110121763 A 8/2019
(Continued)

OTHER PUBLICATIONS

Japanese Office Action issued on Dec. 20, 2022 for Japanese Patent Application No. 2022-507966.
(Continued)

*Primary Examiner* — Jeffrie R Lund
(74) *Attorney, Agent, or Firm* — Volpe Koenig

(57) ABSTRACT

There is provided a technique that includes a first nozzle configured to supply a process gas to a process chamber that processes a substrate, a second nozzle arranged to be spaced apart by a predetermined distance from the first nozzle in a circumferential direction of the substrate and configured to supply an inert gas to the process chamber, and a reaction container defining the process chamber therein and including a first protrusion protruding outward to accommodate the first nozzle and a second protrusion protruding outward to accommodate the second nozzle.

20 Claims, 9 Drawing Sheets

(52) U.S. Cl.
CPC .. *C23C 16/45517* (2013.01); *C23C 16/45519* (2013.01); *C23C 16/45574* (2013.01); *C23C 16/4583* (2013.01)

(58) Field of Classification Search
CPC ........ C23C 16/45519; C23C 16/45574; C23C 16/4583; C23C 16/345; C23C 16/45523; C23C 16/52; C23C 16/4408; C23C 16/45548; H01L 21/0217; H01L 21/02211; H01L 21/0228; H01L 21/67103; H01L 21/31; H01L 21/67017
USPC ........................................................ 118/715
See application file for complete search history.

(56) References Cited

U.S. PATENT DOCUMENTS

| | | | |
|---|---|---|---|
| 2013/0327273 A1* | 12/2013 | Okada | C23C 16/45578 |
| | | | 118/715 |
| 2018/0076017 A1 | 3/2018 | Hashimoto et al. | |
| 2019/0345605 A1 | 11/2019 | Mimura et al. | |
| 2022/0341041 A1* | 10/2022 | Sakai | H01L 21/67103 |
| 2022/0403510 A1* | 12/2022 | Mimura | H01L 21/0217 |
| 2024/0318306 A1* | 9/2024 | Nishida | C23C 16/4412 |

FOREIGN PATENT DOCUMENTS

| | | | | |
|---|---|---|---|---|
| JP | 2018046129 A | | 3/2018 | |
| KR | 10-2018-0116224 A | | 10/2018 | |
| TW | I470112 B | * | 1/2015 | |
| TW | 201843339 A | | 12/2018 | |
| WO | 2016157401 A1 | | 10/2016 | |
| WO | WO-2018154823 A1 | * | 8/2018 | .......... C23C 16/345 |
| WO | WO-2021020008 A1 | * | 2/2021 | ....... C23C 16/45519 |

OTHER PUBLICATIONS

Taiwan Office Action issued on Aug. 10, 2022 for Taiwan Patent Application No. 110104678.
Korean Office Action issued on Sep. 27, 2024 for Korean Patent Application No. 10-2022-7022819.
Chinese Office Action issued on Jan. 24, 2025 for Chinese Patent Application No. 202080091468.X.
International Search Report, PCT/JP2020/012340, Jul. 21, 2020 (5 pgs).
Korean Office Action issued on Jul. 31, 2025 for Korean Patent Application No. 10-2022-7022819.
Singapore Written Opinion issued on Dec. 24, 2025 for Singapore Patent Application No. 11202251067X.

* cited by examiner

FIG. 5A

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Applications of PCT International Application No. PCT/JP2020/012340, filed on Mar. 19, 2020, the entire contents of which are incorporated herein by reference.

TECHNICAL FIELD

The present disclosure relates to a substrate processing apparatus, a method of manufacturing a semiconductor device, and a recording medium.

BACKGROUND

As a process of manufacturing a semiconductor device, a process of supplying a process gas to a substrate (wafer) in a process chamber and forming a film on the substrate is performed. Along with the high miniaturization and increased layering of a semiconductor device, when the wafer in the process chamber is a pattern wafer, the in-plane film thickness uniformity of the film formed on the wafer may sometimes deteriorate because the supply amount of the process gas is insufficient near the center of the wafer. In view of this, the process gas is sometimes supplied to the center of the wafer to improve the in-plane film thickness uniformity on the wafer.

SUMMARY

The present disclosure provides some embodiments of a configuration capable of improving an in-plane film thickness uniformity of a film formed on a substrate.

According to one embodiment of the present disclosure, there is provided a technique that includes: a first nozzle configured to supply a process gas to a process chamber that processes a substrate; a second nozzle arranged to be spaced apart by a predetermined distance from the first nozzle in a circumferential direction of the substrate and configured to supply an inert gas to the process chamber; and a reaction container defining the process chamber therein and including a first protrusion protruding outward to accommodate the first nozzle and a second protrusion protruding outward to accommodate the second nozzle, wherein the inert gas supplied from the second nozzle is supplied toward the first nozzle to cause the flow direction of the process gas to be oriented toward the substrate.

BRIEF DESCRIPTION OF DRAWINGS

The accompanying drawings, which are incorporated in and constitute a part of the specification, illustrate embodiments of the present disclosure.

FIG. 5A is a diagram showing a concentration distribution of precursor radicals in the process furnace of the substrate processing apparatus preferably used in one embodiment of the present disclosure.

DETAILED DESCRIPTION

Figure 1:
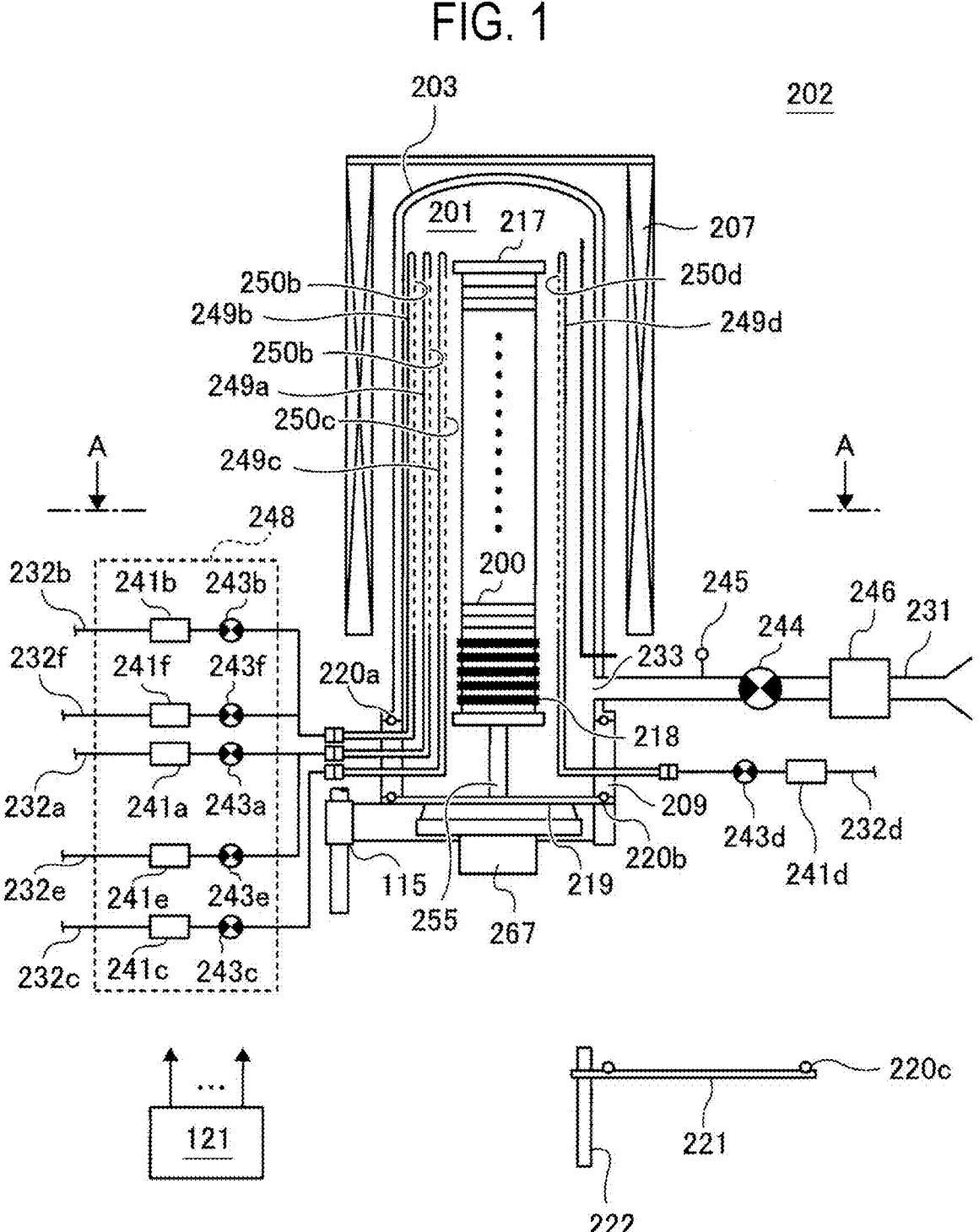
FIG. 1 is a schematic configuration diagram of a substrate processing apparatus preferably used in one embodiment of the present disclosure, in which a process furnace is shown in a vertical sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, one embodiment of the present disclosure will be described with reference to FIGS. 1 to 4. In the following description, the same components may be designated by like reference numerals and the repeated description thereof may be omitted.

(1) Configuration of Substrate Processing Apparatus

As shown in FIG. 1, a process furnace 202 includes a heater 207 as a heating means (heating mechanism). The heater 207 has a cylindrical shape and is vertically installed by being supported by a holding plate. The heater 207 also functions as an activator (excitation part) for activating (exciting) a gas with heat.

Inside the heater 207, a reaction tube 203 is arranged concentrically with the heater 207. The reaction tube 203 is made of a heat-resistant material such as quartz ($SiO_2$) or silicon carbide (SiC), and is formed in a cylindrical shape with a closed upper end and an open lower end. Below the reaction tube 203, a manifold 209 is arranged concentrically with the reaction tube 203. The manifold 209 is made of a metal such as a nickel alloy or the like, and is formed in a short cylindrical shape with open upper and lower ends. The upper end of the manifold 209 engages with the lower end of the reaction tube 203 to support the reaction tube 203. An O-ring 220a as a seal is provided between the manifold 209 and the reaction tube 203. The reaction tube 203 is installed vertically like the heater 207. A process container (reaction container) is mainly composed of the reaction tube 203 and the manifold 209. A process chamber 201 is formed inside the process container. The process chamber 201 is configured to accommodate wafers 200 as substrates.

In the process chamber 201, a nozzle 249a as a first gas nozzle for supplying a film-forming gas (process gas), a nozzle 249b as a second gas nozzle for supplying a film-forming gas (process gas), a nozzle 249c as a third gas nozzle for supplying an inert gas, and a nozzle 249d as a fourth gas nozzle for supplying an inert gas are installed to penetrate the side wall of the manifold 209. Gas supply pipes 232a to 232d are connected to the nozzles 249a to 249d, respectively.

The nozzles 249a and 249b are used as process gas nozzles for supplying a film-forming gas (process gas) to the process chamber 201. Further, the nozzle 249c and the nozzle 249b are used as inert gas nozzles for supplying an inert gas to the process chamber 201. The nozzles 249c and 249d are used as counter nozzles for supplying an inert gas from a system different from the film-forming gas supply system. Two counter nozzles are arranged in the process chamber 201. The counter nozzles are arranged at a predetermined distance from the process gas nozzles in a circumferential direction of the wafer 200, respectively.

In the gas supply pipes 232a to 232d, mass flow controllers (MFCs) 241a to 241d, which are flow rate controllers (flow control parts), and valves 243a to 243d, which are on-off valves, are respectively installed sequentially from the upstream side of the gas flow. Gas supply pipes 232e and 232f for supplying an inert gas are connected to the gas supply pipes 232a and 232b on a downstream side of the valves 243a and 243b, respectively. In the gas supply pipes 232e and 232f, MFCs 241e and 241f and valves 243e and 243f are respectively installed sequentially from an upstream side of the gas flow.

The reaction tube 203 has a first protrusion 302 protruding outward to accommodate the nozzle 249a and 249b, a second protrusion 303 protruding outward to accommodate the nozzle 249c, and a third protrusion 304 protruding outward to accommodate the nozzle 249d. The first protrusion 302 may be divided into a plurality of portions to accommodate the nozzle 249a and the nozzle 249b, respectively.

The first protrusion 302 is formed at a position facing an exhaust port 233. The second protrusion 303 and the third protrusion 304 are formed at positions respectively spaced apart by a predetermined distance from the first protrusion 302 in a circumferential direction of the reaction tube 203. As used herein, the term "predetermined distance" is a length of an arc within a range of 15° or more and 120° or less from the first protrusion 302 in the circumferential direction of the reaction tube 203. In other words, the predetermined distance is a length of an arc within a range of 15° or more and 120° or less which is an angle θ formed by a straight line connecting a center of the first protrusion 302 of the reaction tube 203 and a center of the wafer 200 and a straight line connecting a center of each of the second protrusion 303 and the third protrusion 304 and a center of the wafer 200. The second protrusion 303 and the third protrusion 304 are arranged line-symmetrically to a straight line connecting the center of the first protrusion 302 and a center of the exhaust port 233.

Figure 2:
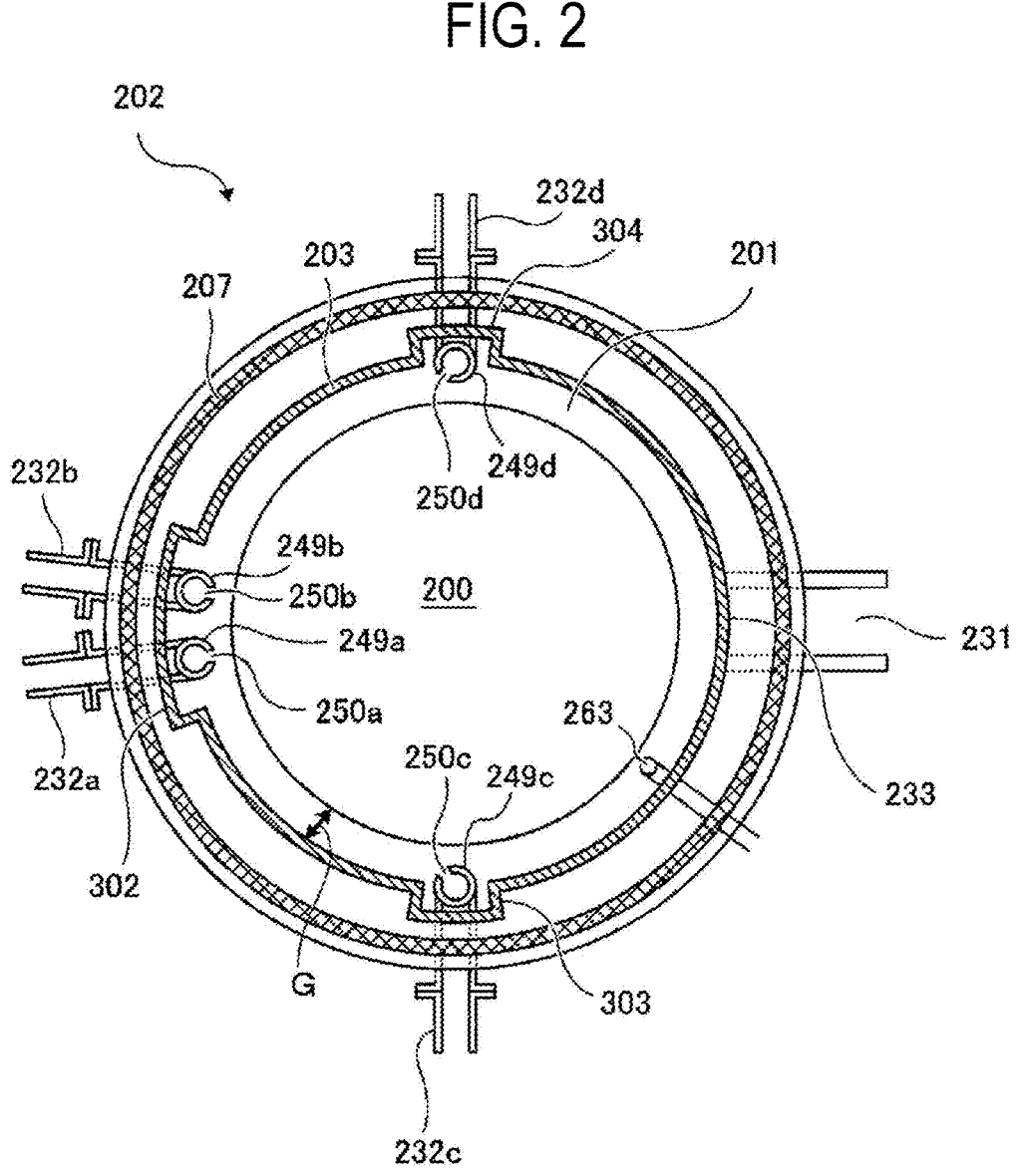
FIG. 2 is a sectional view taken along line A-A in FIG. 1, showing a part of the process furnace of the substrate processing apparatus preferably used in one embodiment of the present disclosure.

In the example shown in FIG. 2, the second protrusion 303 and the third protrusion 304 are formed at positions 900 spaced apart from the first protrusion 302 in the circumferential direction of the reaction tube 203, respectively. That is, the second protrusion 303 is formed at a position facing the third protrusion 304.

The first protrusion 302 constitutes a part of the process chamber 201 therein, and is configured to accommodate the nozzles 249a and 249b. The second protrusion 303 constitutes a part of the process chamber 201 therein, and is configured to accommodate the nozzle 249c. The third protrusion 304 constitutes a part of the process chamber 201 therein, and is configured to accommodate the nozzle 249d.

As shown in FIG. 2, the nozzles 249a and 249b are respectively installed in the first protrusion 302 to extend from the lower side to the upper side of the reaction tube 203 along the arrangement direction of the wafers 200. The nozzles 249a and 249b are arranged adjacent to each other in the first protrusion 302. The nozzles 249a and 249b are arranged to face the below-described exhaust port 233 across the centers of the wafers 200 loaded into the process chamber 201.

As shown in FIG. 2, the nozzles 249c and the nozzles 249d are respectively installed in the second protrusion 303 and the third protrusion 304 to extend from a lower side to an upper side of the reaction tube 203 along an arrangement direction of the wafers 200. That is, the nozzles 249c and 249d are installed at positions spaced apart by a predetermined distance from the nozzles 249a and 249b in the circumferential direction of the loaded wafers 200. As used herein, the term "predetermined distance" is a length of an arc which is at least twice the gap G between an inner wall surface of the reaction tube 203 and the peripheral edge portions of the wafers 200 and is a length of an arc within a range of 15° or more and 120° or less from the nozzles 249a and 249b in the circumferential direction of the wafers 200. In other words, the predetermined distance is the length of an arc within a range of 15° or more and 120° or less which is an angle θ formed by a straight line connecting the center of the process gas nozzle and the center of the wafer 200 and a straight line connecting the center of each of the nozzle 249c and the nozzle 249d. That is, the nozzles 249c and 249d are arranged at the distance of an arc that is at least twice the gap G in the circumferential direction of the loaded wafer 200 from the nozzles 249a and 249b and at the positions of 15° or more and 120° or less from a straight line connecting the center of the process gas nozzle and the center of the wafer in the circumferential direction of the loaded wafer 200. The nozzles 249c and 249d are arranged line-symmetrically to a straight line connecting the center of the process gas nozzle and the center of the exhaust port 233. That is, the nozzle 249d is installed in a region opposite to the region where the nozzle 249c is installed, among the regions defined by a straight line connecting the center of the process gas nozzle and the center of the exhaust port 233. As used herein, the center of the process gas nozzle refers to the center of the nozzle 249a, the center of the nozzle 249b, or a midpoint between the center of the nozzle 249a and the center of the nozzle 249b.

In this regard, the gas supplied from the nozzles 249a to 249d has a blowout flow by which the gas is discharged in a facing direction of the gas supply holes 250a to 250d, and a drawing-in flow by which the gas flows around the nozzles 249a to 249d, whereby a vortex flow circulates. When the nozzles 249c and 249d are arranged at the positions smaller than 15° in the circumferential direction of the wafer 200 from the straight line connecting the center of the process gas nozzle and the center of the wafer, the nozzles 249a and 249b and the nozzles 249c and 249d are close to each other. Thus, the vortex flow of the process gas supplied from the nozzles 249a and 249b and the vortex flow of the inert gas supplied from the nozzles 249c and 249d are merged with each other. That is, the process gas is diluted with the inert gas supplied from the nozzles 249c and 249d.

Further, when the nozzles 249c and 249d are arranged at positions larger than 120° in the circumferential direction of the loaded wafer 200 from the straight line connecting the center of the process gas nozzle and the center of the wafer, the range in which the process gas supplied from the nozzles 249a and 249b and the inert gas supplied from the nozzles 249c and 249d can interfere with each other becomes small. Therefore, the degree of influence of the vortex flow of the inert gas diminishes without affecting the wafer 200. Accordingly, the nozzles 249c and 249d are preferably arranged at the positions spaced apart from the nozzles 249a and 249b by the length of an arc which is more than twice the gap G and at the positions of 15° or more and 120° or less in the circumferential direction of the loaded wafer 200 from the straight line connecting the center of the process gas nozzle and the center of the wafer.

Gas supply holes 250a to 250d for supplying a gas are formed on the side surfaces of the nozzles 249a to 249d, respectively. Each of the gas supply holes 250a and 250b can supply a gas toward the center of each wafer 200. A plurality of gas supply holes 250a and 250b is formed to be opened toward the center of each wafer 200 over a range from the lower portion to the upper portion of the reaction tube 203.

The gas supply holes 250c and 250d can supply the inert gas toward the nozzles 249a and 249b, respectively. That is, a plurality of gas supply holes 250c and 250d are formed to be opened toward the nozzles 249a and 249b, respectively, over a range from the lower portion to the upper portion of the reaction tube 203.

Specifically, each of the gas supply holes 250c and 250d is formed to be opened toward the nozzles 249a and 249b, for example, at 45° to the center of the wafer, and is formed to be able to supply the inert gas toward the wall of the first protrusion 302. That is, a plurality of gas supply holes 250c and 250d is formed to be opened toward the nozzles 249a and 249b, for example, at 45° to the center of the wafer over a range from the lower portion to the upper portion of the reaction tube 203, and is opened toward the inside of the wall of the first protrusion 302 to be able to supply the inert gas toward the wall of the first protrusion 302. By supplying the inert gas from the gas supply holes 250c and 250d, a vortex flow of the inert gas is formed in a vicinity of the second protrusion 303 and the third protrusion 304. The vortex flow of the inert gas blocks the flow of the process gas flowing from the upstream side of the gap G region. That is, the process gas flowing on the upstream side of the gap G region is prevented from flowing to the downstream side of the gap G region. Further, due to the vortex flow of the inert gas, the process gas flowing on the upstream side of the gap G region flows toward the center of the wafer 200 without being mixed with the inert gas.

In this regard, when the gas supply holes 250c and 250d are oriented toward the nozzles 249a and 249b rather than the wall, the inert gas supplied from the nozzles 249c and 249d collides with the inside of the first protrusion 302, and the diameter of the vortex flow of the inert gas becomes smaller. Thus, the above-mentioned effect is diminished. Further, when the gas supply holes 250c and 250d are oriented toward the opposite side of the nozzles 249a and 249b (exhaust side) from the wall, the inert gas is caught in the vortex flow on the side of the first protrusion 302 and is mixed with the process gas. Thus, the above-mentioned effect is diminished.

From the gas supply pipe 232a, a precursor gas (process gas), for example, a halosilane-based gas containing Si as a predetermined element (main element) and a halogen element is supplied to the process chamber 201 via the MFC 241a, the valve 243a, and the nozzle 249a.

From the gas supply pipe 232b, a reactant as a process gas having a different chemical structure (molecular structure) from the above-mentioned precursor, for example, a hydrogen nitride-based gas as a nitride gas is supplied to the process chamber 201 via the MFC 241b, the valve 243b, and the nozzle 249b. The hydrogen nitride-based gas acts as an N source. As the hydrogen nitride-based gas, for example, an ammonia ($NH_3$) gas may be used.

From the gas supply pipes 232c to 232f, an inert gas, for example, a nitrogen ($N_2$) gas is supplied to the process chamber 201 via the MFCs 241c to 241f, the valves 243c to 243f, the gas supply pipes 232c, 232d, 232a and 232b, and the nozzles 249c, 249d, 249a and 249b, respectively. The $N_2$ gas acts as a purge gas and a carrier gas, and further acts as a film thickness distribution control gas that controls the in-plane film thickness distribution of the film formed on the wafer 200.

A process gas supply system is mainly composed of the gas supply pipes 232a and 232b, the MFCs 241a and 241b, and the valves 243a and 243b. Further, an inert gas supply system is mainly composed of the gas supply pipes 232c to 232f, the MFCs 241c to 241f, and the valves 243c to 243f.

The reaction tube 203 is provided with an exhaust port 233 as an exhauster for exhausting the atmosphere in the process chamber 201. As can be noted from a horizontal sectional view shown in FIG. 2, the exhaust port 233 is provided at a position facing the nozzles 249a and 249b (the gas supply holes 250a and 250b) across the wafers 200 interposed therebetween. An exhaust pipe 231 is connected to the exhaust port 233. The exhaust pipe 231 is provided with a pressure sensor 245 as a pressure detector for detecting the pressure in the process chamber 201, and is connected to the vacuum pump (vacuum evacuation device) 246 via an APC (Auto Pressure Controller) valve 244 as a pressure regulator. The APC valve 244 is configured so that the vacuum evacuation and vacuum evacuation stop for the process chamber 201 can be performed by opening and closing the APC valve 244 while operating the vacuum pump 246, and the pressure in the process chamber 201 can be regulated by adjusting the opening degree of the APC valve 244 based on the pressure information detected by the sensor 245 while operating the vacuum pump 246. An exhaust system is mainly composed of the exhaust pipe 231, the APC valve 244, and the pressure sensor 245. The vacuum pump 246 may also be included in the exhaust system.

Below the manifold 209, a seal cap 219 is installed as a furnace opening lid capable of airtightly closing the lower end opening of the manifold 209. For example, the seal cap 219 is made of metal, and is formed in a disk shape. An O-ring 220b as a seal that comes into contact with the lower end of the manifold 209 is installed on an upper surface of the seal cap 219. Below the seal cap 219, a rotator 267 for rotating a boat 217, which will be described later, is installed. The rotary shaft 255 of the rotator 267 penetrates the seal cap 219 and is connected to the boat 217. The rotator 267 rotates the wafers 200 by rotating the boat 217.

The seal cap 219 is configured to be vertically raised or lowered by a boat elevator 115 as an elevating mechanism installed outside the reaction tube 203. The boat elevator 115 is configured as a transfer device (transfer mechanism) for loading and unloading (transferring) the wafers 200 into and from the process chamber 201 by raising and lowering the seal cap 219. Further, a shutter 221 as a furnace opening lid that airtightly closes the lower end opening of the manifold 209 while lowering the seal cap 219 and completely unloading the boat 217 from the process chamber 201 is installed below or on the lateral side of the manifold 209. The shutter 221 is formed in a disk shape just like the seal cap 219. An O-ring 220c that abuts on the lower end of the manifold 209 is installed on the upper surface of the shutter 221. The opening/closing operation (the raising/lowering operation, the rotating operation, etc.) of the shutter 221 is controlled by a shutter opening/closing mechanism 222.

The boat 217 as a substrate support is configured to support a plurality of, for example, 25 to 200, wafers 200 in a horizontal posture, in multiple stages and in a vertically aligned state with the centers thereof aligned with each other, i.e., arrange the wafers 200 at intervals. The boat 217 is made of a heat-resistant material such as quartz or SiC. In the lower portion of the boat 217, heat insulating plates 218 made of a heat-resistant material such as quartz or SiC are supported in multiple stages.

A temperature sensor 263 as a temperature detector is installed in the reaction tube 203. By adjusting a condition of power supply to the heater 207 based on the temperature information detected by the temperature sensor 263, the temperature of the process chamber 201 has a desired temperature distribution. The temperature sensor 263 is installed along the inner wall of the reaction tube 203.

Figure 3:
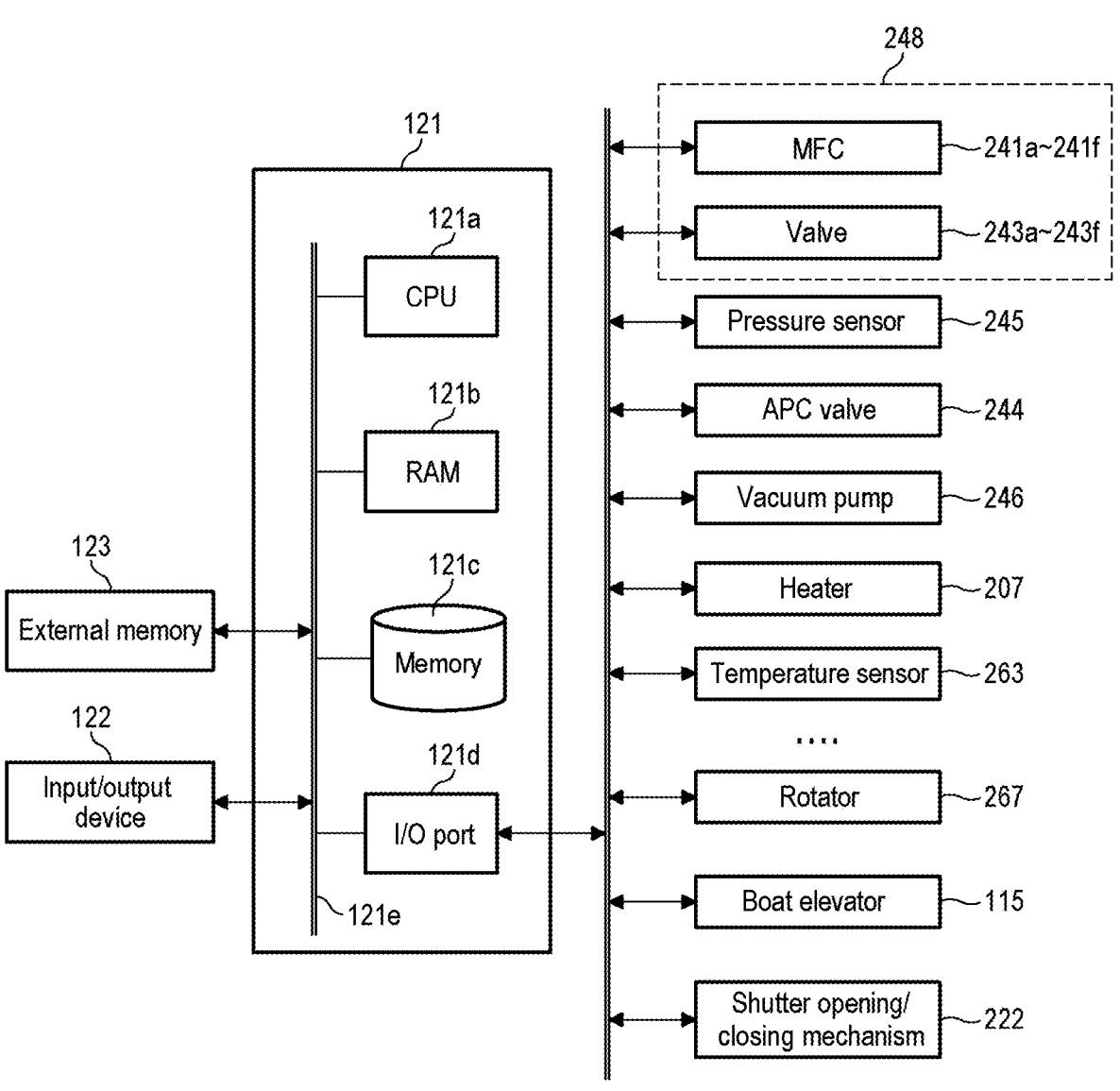
FIG. 3 is a schematic configuration diagram of a controller of the substrate processing apparatus preferably used in one embodiment of the present disclosure, in which a control system of the controller is shown in a block diagram.

As shown in FIG. 3, the controller 121, which is a control part (control means), is configured as a computer including a CPU (Central Processing Unit) 121a, a RAM (Random Access Memory) 121b, a memory 121c, and an I/O port 121d. The RAM 121b, the memory 121c, and the I/O port 121d are configured to exchange data with the CPU 121a via an internal bus 121e. An input/output device 122 configured as, for example, a touch panel or the like is connected to the controller 121.

The memory 121c is composed of, for example, a flash memory, an HDD (Hard Disk Drive), or the like. The memory 121c readably stores a control program for controlling the operation of the substrate processing apparatus, a process recipe in which the procedure and conditions for a substrate processing process described later are written, and the like. The process recipe is configured to cause the controller 121 to execute each procedure in the below-described substrate processing process to obtain a predetermined result. The process recipe functions as a program. Hereinafter, the process recipe, the control programs, etc. are collectively and simply referred to as programs. In addition, the process recipe is also simply referred to as a recipe. When the term program is used in the subject specification, it may include the recipe, the control program, or both of them. The RAM 121b is configured as a memory area (work area) in which programs, data, and the like read by the CPU 121a are temporarily held.

The I/O port 121d is connected to the MFCs 241a to 241f, the valves 243a to 243f, the pressure sensor 245, the APC valve 244, the vacuum pump 246, the temperature sensor 263, the heater 207, the rotator 267, the boat elevator 115, the shutter opening/closing mechanism 222, and the like.

The CPU 121a is configured to read a control program from the memory 121c to execute the same and is configured to read a recipe from the memory 121c in response to an input of an operation command from the input/output device

122 or the like. The CPU 121a is configured to, according to the contents of the recipe thus read, control the flow rate adjustment operation for various gases by the MFCs 241a to 241f, the opening and closing operation of the valves 243a to 243f, the opening and closing operation of the APC valve 244, the pressure regulation operation by the APC valve 244 based on the pressure sensor 245, the start and stop of the vacuum pump 246, the temperature adjustment operation of the heater 207 based on the temperature sensor 263, the rotation and rotation speed adjustment operation of the boat 217 by the rotator 267, the raising and lowering operation of the boat 217 by the boat elevator 115, the opening and closing operation of the shutter 221 by the shutter opening/closing mechanism 222, and the like.

The controller 121 may be configured by installing the above-mentioned program stored in an external memory (e.g., a magnetic disk such as a hard disk or the like, an optical disk such as a CD or the like, a magneto-optical disk such as an MO or the like, or a semiconductor memory such as a USB memory or the like) 123 into a computer. Each of the memory 121c and the external memory 123 is configured as a computer-readable recording medium. Hereinafter, these are collectively and simply referred to as a recording medium. When the term recording medium is used in the subject specification, it may include the memory 121c, the external memory 123, or both of them. The program may be provided to the computer by using a communication means such as the Internet or a dedicated line without using the external memory 123.

(2) Film-Forming Process

As a process of manufacturing a semiconductor device using the above-described substrate processing apparatus, an example of a sequence in which a silicon nitride film (SiN film) is formed on a wafer 200 as a substrate will be described with reference to FIG. 4. In the following description, the operation of each part constituting the substrate processing apparatus is controlled by the controller 121.

Figure 4:
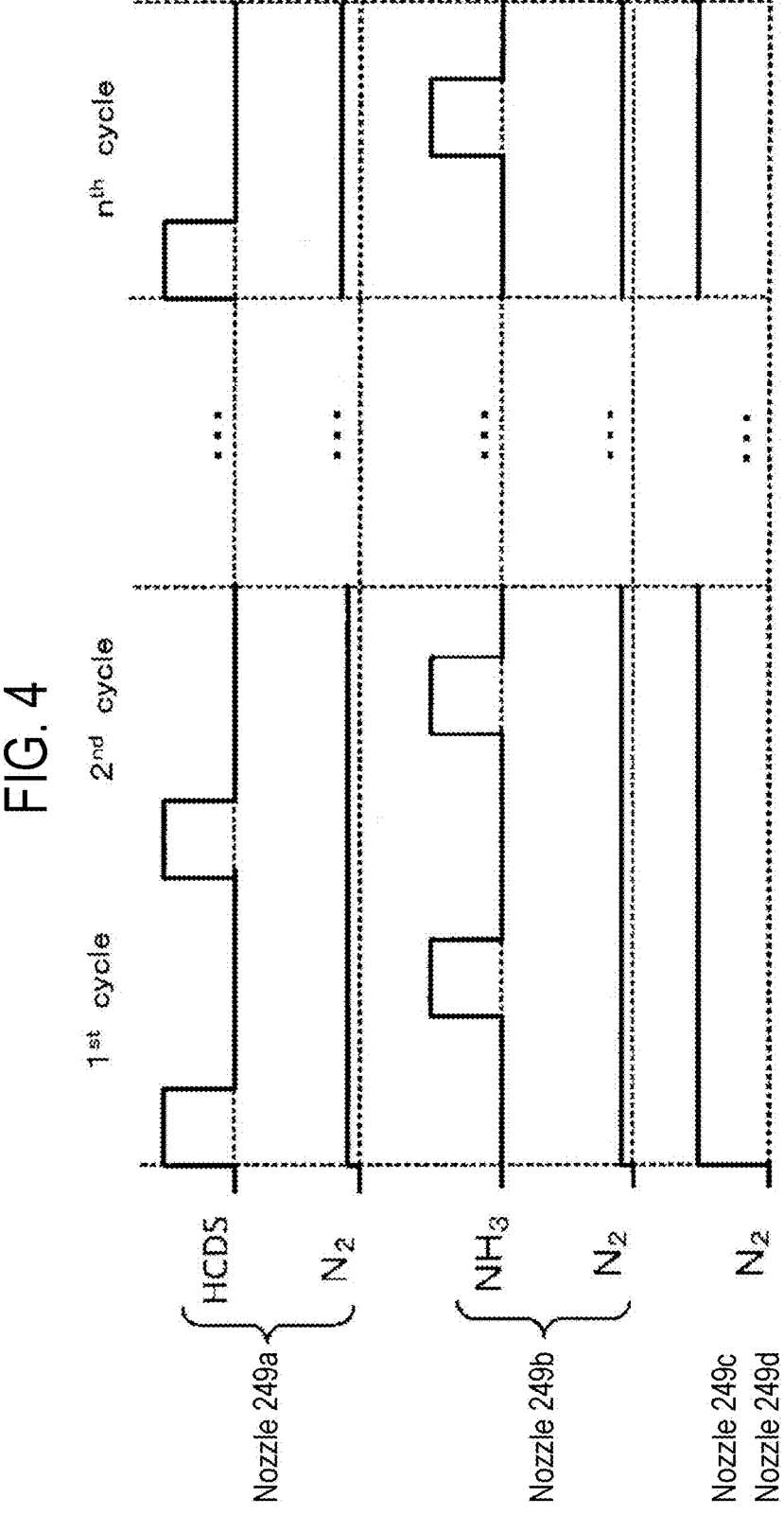
FIG. 4 is a diagram showing a film-forming sequence of the substrate processing apparatus preferably used in one embodiment of the present disclosure.

In the film-forming sequence shown in FIG. 4, a film containing Si and N, i.e., a SiN film is formed on a wafer 200 by performing a cycle n times (n is a predetermined number), the cycle including non-simultaneously performing:

step A of forming a Si-containing layer as a first layer by supplying a HCDS gas to the wafer 200 from a nozzle 249a; and step B of forming a silicon nitride layer (SiN layer) as a second layer by supplying an $NH_3$ gas to the wafer 200 from a nozzle 249b.

In the subject specification, the film-forming sequence shown in FIG. 4 may be denoted as follows for the sake of convenience.

$$(HCDS \rightarrow NH_3) \times n \Rightarrow SiN$$

When the term "wafer" is used herein, it may refer to "a wafer itself" or "a stacked body of a wafer and a predetermined layer or film formed on the surface of the wafer." When the term "wafer surface" is used herein, it may refer to "a surface of a wafer itself" or "a surface of a predetermined layer or a film formed on a wafer." In the subject specification, the term "substrate" includes the meaning of "wafer."

(Wafer Charging and Boat Loading)

When a plurality of wafers 200 is charged into the boat 217 (wafer charging), the shutter 221 is moved by the shutter opening/closing mechanism 222 to open the lower end opening of the manifold 209 (shutter opening). Thereafter, as shown in FIG. 1, the boat 217 supporting the plurality of wafers 200 is raised by the boat elevator 115 and loaded into the process chamber 201 (boat loading). After the loading is completed, the seal cap 219 is in a state in which the seal cap 219 seals a lower end of the manifold 209 via the O-ring 220*b*.

(Pressure Regulation and Temperature Adjustment)

The process chamber 201 is evacuated (depressurized) by the vacuum pump 246 so that the process chamber 201, i.e., the space in which the wafers 200 exist, has a desired pressure (vacuum degree). At this time, the pressure in the process chamber 201 is measured by the pressure sensor 245, and the APC valve 244 is feedback-controlled based on the measured pressure information. Further, the wafers 200 in the process chamber 201 are heated by the heater 207 to have a desired film-forming temperature. At this time, the power supply to the heater 207 is feedback-controlled based on the temperature information detected by the temperature sensor 263 so that the process chamber 201 has a desired temperature distribution. Further, the rotation of the wafers 200 by the rotator 267 is started. The evacuation of the process chamber 201 and the heating and rotation of the wafers 200 are all continuously performed at least until the processing of the wafers 200 is completed.

(Film-Forming Step)

Thereafter, the next steps A and B are sequentially executed.

[Step A]

In this step, an HCDS gas is supplied to the wafers 200 in the process chamber 201.

Specifically, the valve 243*a* is opened to allow the HCDS gas to flow into the gas supply pipe 232*a*. The flow rate of the HCDS gas is adjusted by the MFC 241*a*. The HCDS gas is supplied into the process chamber 201 via the nozzle 249*a*, and is exhausted from the exhaust port 233. That is, the HCDS gas is supplied to the wafers 200. At this time, the valve 243*e* may be opened to allow the N$_2$ gas to flow into the gas supply pipe 232*e*. The flow rate of the N$_2$ gas is adjusted by the MFC 241*e*. The N$_2$ gas may be supplied to the process chamber 201 together with the HCDS gas through the nozzle 249*a*, and may be exhausted from the exhaust port 233. In step A, the HCDS gas is supplied to the process chamber 201 via the nozzle 249*a*, and the N$_2$ gas is supplied to the process chamber 201 via the nozzles 249*c* and 249*d*. The N2 gas supplied from the nozzles 249*c* and 249*d* is supplied toward the nozzle 249*a* to form a vortex flow of the inert gas in the vicinity of the second protrusion 303 and the third protrusion 304. The details will be described later.

In step A, the flow rate of the HCDS gas supplied from the nozzle 249*a* is, for example, in the range of 1 sccm or more and 2000 sccm or less, preferably 10 sccm or more and 1000 sccm or less. The flow rate of the N$_2$ gas supplied from the nozzles 249*c* and 249*d* is, for example, 500 sccm, and is set to about ¼ or more and ⅔ or less of the total flow rate of the HCDS gas including the N$_2$ gas supplied from the nozzle 249*a*.

When a flow rate of the N$_2$ gas supplied from the nozzles 249*c* and 249*d* is less than ¼ of a total flow rate of the HCDS gas to the total flow rate of the HCDS gas supplied from the nozzle 249*a*, the N$_2$ gas supplied from the nozzles 249*c* and 249*d* is overwhelmed by the HCDS gas. That is, the precursor gas flowing in the Gap G region flows to a downstream side without being diluted, whereby the total amount of the precursor gas reaching a center of the wafer 200 is reduced. That is, a film thickness distribution of the film formed on the wafer 200 becomes concave, and the in-plane film thickness uniformity deteriorates.

Further, when the flow rate of the N$_2$ gas supplied from the nozzles 249*c* and 249*d* is larger than ⅔ of the total flow rate of the HCDS gas to the total flow rate of the HCDS gas supplied from the nozzle 249*a*, the nozzle 249*c*, an effect of diluting the precursor gas flowing in the gap G region with the N$_2$ gas supplied from the nozzles 249*c* and 249*d* increases, and the total amount of the precursor gas reaching the center of the wafer increases too much. That is, the film thickness distribution of the film formed on the wafer 200 becomes convex, and the in-plane film thickness uniformity deteriorates.

Therefore, the flow rate of the N$_2$ gas supplied from the nozzles 249*c* and 249*d* is set to a predetermined flow rate of about ¼ to ⅔ of the total flow rate of the HCDS gas including the N$_2$ gas supplied from the nozzle 249*a*. These flow rate conditions vary depending on the surface area of the wafers 200, the wafer pitch, the width of the gap G, the positions of the nozzles 249*c* and 249*d*, the orientations of the gas supply holes 250*c* and 250*d* of the nozzles 249*c* and 249*d*, the gas type, the film-forming temperature, the processing pressure, and the like.

A supply time of the HCDS gas is set to, for example, a predetermined time within the range of 1 second or more and 120 seconds or less, preferably 1 second or more and 60 seconds or less. The pressure in the process chamber 201 is set to, for example, a predetermined pressure within the range of 1 Pa or more and 2666 Pa or less, preferably 67 Pa or more and 1333 Pa or less. The temperature (film-forming temperature) of the wafer 200 is set to, for example, a predetermined temperature within the range of 250 degrees C. or higher and 800 degrees C. or lower, preferably 400 degrees C. or higher and 750 degrees C. or lower, and more preferably 550 degrees C. or higher and 700 degrees C. or lower.

By supplying the HCDS gas and the N$_2$ gas to the wafer 200 under the above conditions, a Si-containing layer containing Cl and having a thickness of, for example, from less than one atomic layer to several atomic layers (from less than one molecular layer to several molecular layers) is formed as a first layer on the outermost surface of the wafer 200. The Si-containing layer containing Cl may be a Si layer containing Cl, an adsorption layer of HCDS, or both of them.

Under a condition that the HCDS gas is autolyzed (thermally decomposed), the Si layer containing Cl is formed by depositing Si on the wafer 200. Under a condition that the HCDS gas is not self-decomposed (thermally decomposed), an adsorption layer of HCDS is formed by allowing HCDS to be adsorbed on the wafer 200. From a viewpoint of the deposition rate, it is preferable to form the Si layer containing Cl rather than the adsorption layer of HCDS. Hereinafter, the Si-containing layer containing Cl is also simply referred to as a Si-containing layer for the sake of convenience.

In step A, in a state in which the HCDS gas is supplied from the nozzle 249*a*, the valves 243*c* to 243*f* are opened to allow the N$_2$ gas to flow into the gas supply pipes 232*c*, 232*d* and 232*b*. The N$_2$ gas is supplied from the nozzles 249*c*, 249*d* and 249*b* into the process chamber 201. Supply of a small amount of N$_2$ gas from the nozzle 249*b* may not be maintained, but it is preferable to maintain the supply of the small amount of N$_2$ gas from the viewpoint of suppressing an entry of the HCDS gas into the nozzle 249*b*. Therefore, the supply of the N$_2$ gas from the nozzle 249*b* is preferably started at the same time as or before step A.

In step A, each flow rate (first flow rate) of the N$_2$ gas supplied from the nozzles 249*a* and 249*b* is set to be smaller than the flow rate of the $N_2$ supplied from the nozzles 249c and 249d. Further, the respective flow rates of the $N_2$ gas supplied from the nozzles 249c and 249d are set so that the total flow rate thereof is smaller than the total flow rate of the HCDS gas and the $N_2$ gas supplied from the nozzle 249a.

After the first layer having the desired thickness and in-plane thickness distribution is formed, the valve 243a is closed to stop the supply of the HCDS gas. At this time, while keeping the APC valve 244 opened, the inside of the process chamber 201 is evacuated by the vacuum pump 246 to remove the HCDS gas unreacted or contributed to the formation of the first layer, which remains in the process chamber 201. The $N_2$ gas supplied from the nozzles 249a to 249d acts as a purge gas, whereby the inside of the process chamber 201 is purged (purging step).

[Step B]

After step A is completed, an $NH_3$ gas is supplied to the wafers 200 in the process chamber 201, i.e., the first layer formed on the wafer 200.

In this step, the opening/closing control of the valves 243b and 243c to 243f is performed in the same procedure as the opening/closing control of the valves 243a and 243c to 243f in step A. A flow rate of the $NH_3$ gas is adjusted by the MFC 241b. The $NH_3$ gas is supplied into the process chamber 201 via the nozzle 249b, and is exhausted from the exhaust port 233. At this time, the $NH_3$ gas is supplied to the wafer 200.

In step B, the supply flow rate of the $NH_3$ gas supplied from the nozzle 249b is set to, for example, a predetermined flow rate within the range of 1000 to 10000 sccm. At this time, the flow rate of the $N_2$ gas supplied from the nozzles 249c and 249d is set to a predetermined flow rate of about ¼ or more and ⅔ or less of the total flow rate of the $NH_3$ gas including the $N_2$ gas supplied from the nozzle 249b. By setting the flow rate in this way, the same effect as that described in step A can be obtained.

A supply time of the $NH_3$ gas is set to, for example, a predetermined time within the range of 1 second or more and 120 seconds or less, preferably 1 second or more and 60 seconds or less. The pressure in the process chamber 201 is set to, for example, a predetermined pressure within the range of 1 Pa or more and 4000 Pa or less, preferably 1 Pa or more and 3000 Pa or less. By setting the pressure higher than that in step A, even if the $NH_3$ gas activated by heat instead of plasma is used, it is possible to allow the $NH_3$ gas to chemically react with the first layer at a predetermined rate, thereby forming a second layer. Other processing conditions are the same as those in step A. In step B, the importance of the $N_2$ gas supply from the nozzles 249c and 249d is lower than that in step A. The $N_2$ gas may not be supplied.

When the $NH_3$ gas and the $N_2$ gas are supplied to the wafer 200 under the above conditions, at least a part of the first layer formed on the wafer 200 is nitrided (modified). As a result, a second layer containing Si and N, i.e., a SiN layer is formed on the wafer 200. When forming the second layer, impurities such as Cl and the like contained in the first layer form a gaseous substance containing at least Cl in the process of modifying the first layer with the $NH_3$ gas. The gaseous substance is discharged from the process chamber 201. That is, the impurities such as Cl and the like in the first layer are separated from the first layer by being withdrawn or desorbed from the first layer. As a result, the second layer becomes a layer having less impurities such as Cl and the like than the first layer.

After the second layer is formed, the valve 243b is closed to stop the supply of the $NH_3$ gas. Then, by the same processing procedure and processing conditions as in the purging step of step A, the $NH_3$ gas unreacted or contributed to the formation of the second layer and the reaction by-products, which remain in in the process chamber 201, are removed from the inside of the process chamber 201.

[Performed a Predetermined Number of Times]

By performing the cycle in which steps A and B are performed non-simultaneously, i.e., without synchronization, one or more times (n times), a SiN film having a predetermined composition and a predetermined film thickness can be formed on the wafer 200. The above cycle is preferably performed a predetermined number of times. That is, it is preferable that the thickness of the second layer formed when the above-mentioned cycle is performed once is set to be thinner than a desired film thickness, and the above cycle is performed the predetermined number of times until the film thickness of the SiN film formed by stacking the second layers becomes the desired film thickness.

(After-Purging to Atmospheric Pressure Restoration)

When the film having a desired composition and a desired film thickness is formed on the wafer 200, the $N_2$ gas as a purge gas is supplied from each of the nozzles 249a to 249d to the process chamber 201, and is exhausted from the exhaust port 233. As a result, the process chamber 201 is purged, and the gas and reaction by-products remaining in the process chamber 201 are removed from the process chamber 201 (after-purging). Thereafter, the atmosphere in the process chamber 201 is replaced with an inert gas (inert gas replacement), and the pressure in the process chamber 201 is restored to the atmospheric pressure (atmospheric pressure restoration).

(Boat Unloading and Wafer Discharging)

The seal cap 219 is lowered by the boat elevator 115, and a lower end of the manifold 209 is opened. Then, the processed wafers 200 are unloaded from a lower end of the manifold 209 to the outside of the reaction tube 203 while keeping the processed wafers 200 supported by the boat 217 (boat unloading). After the boat is unloaded, the shutter 221 is moved and the lower end opening of the manifold 209 is sealed by the shutter 221 via the O-ring 220c (shutter closing). After the processed wafers 200 are unloaded from the reaction tube 203, they are discharged from the boat 217 (wafer discharging).

(3) Simulation

Figure 5A:
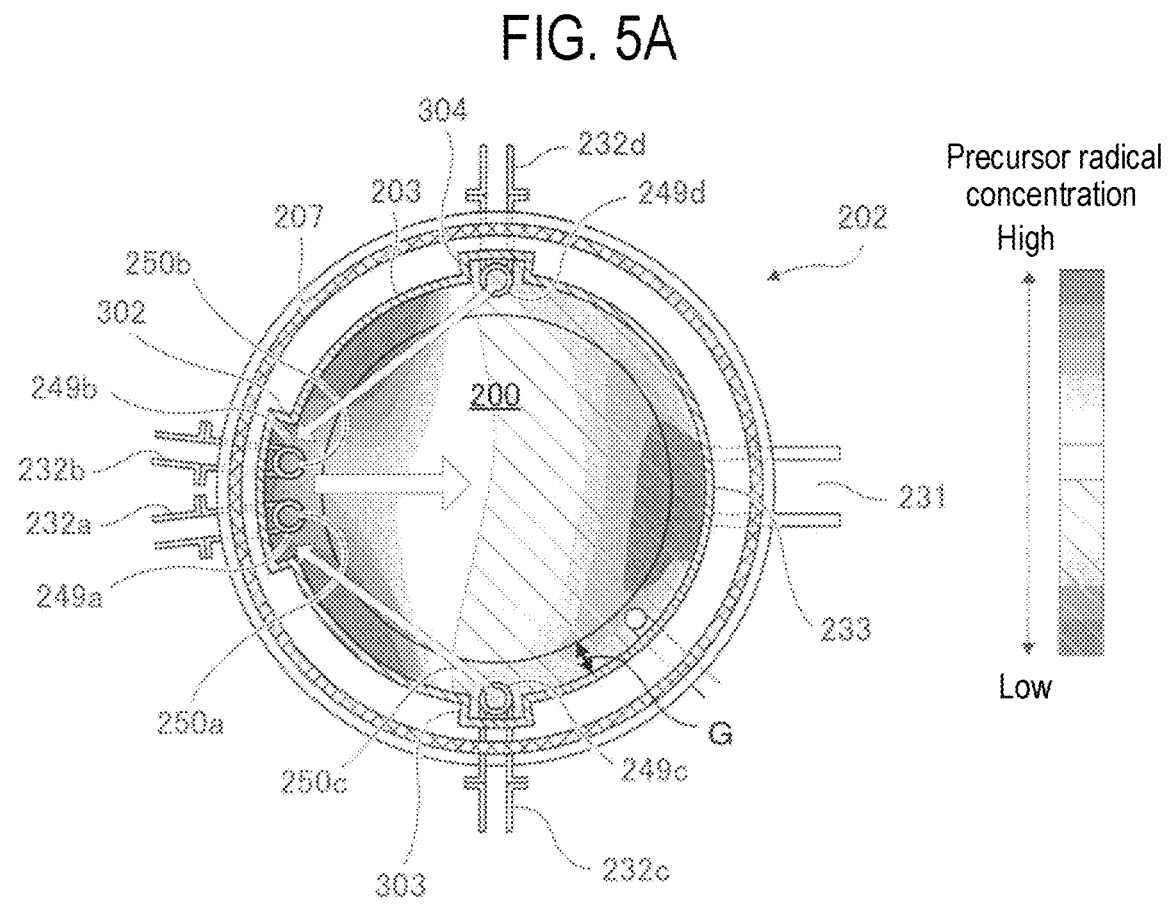
Figure 5B:
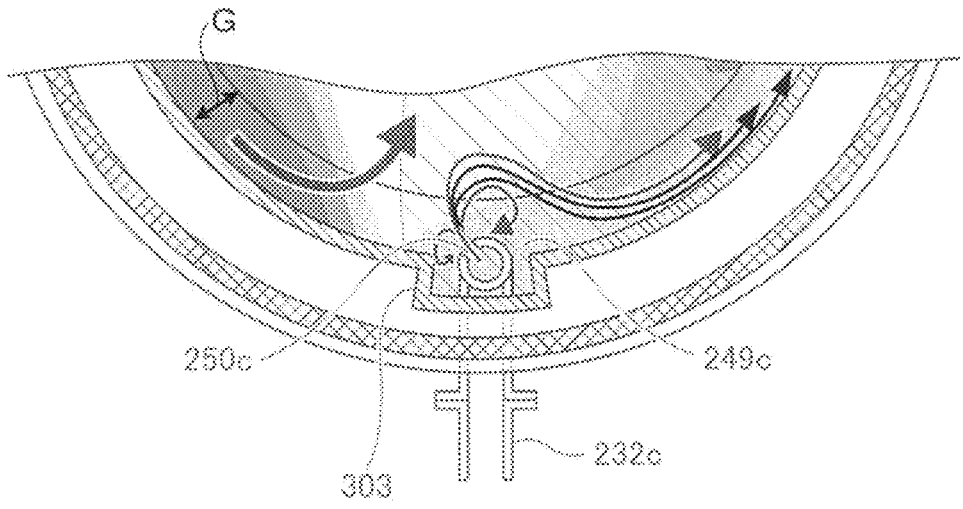
FIG. 5B is a diagram for explaining the flow of a gas near a counter nozzle in FIG. 5A.

By using the process furnace 202 of the substrate processing apparatus shown in FIG. 1 described above, the processing in the film-forming sequence shown in FIG. 4 was performed to form a SiN film on a pattern wafer having a surface area 70 times that of a bare wafer. FIG. 5A is a diagram showing a concentration distribution of precursor radicals in the process furnace 202 in step A of the film-forming sequence shown in FIG. 4, and FIG. 5B is a diagram showing the flow of a gas near the second protrusion 303 in FIG. 5A.

As shown in FIG. 5A, the gas supply holes 250c and 250d of the nozzles 249c and 249d are not oriented toward the center of the wafer, but are oriented in a direction in which the $N_2$ gas is sent to the wall of the first protrusion 302 on the process gas nozzle side. Since the nozzle 249d has the same configuration and effect as those of the nozzle 249c, the following description will be made using the nozzle 249c.

In this simulation, a flow rate of the HCDS gas, which is the precursor gas supplied from the nozzle 249a, was set to 200 sccm, and a flow rate of the $N_2$ gas supplied from the nozzle 249a was set to 12000 sccm. At this time, the flow rate of the $N_2$ gas supplied from the nozzles 249c and 249d was set to 6250 sccm. At this time, the pressure in the process chamber 201 was set to 140 Pa, the film-forming temperature was set to 700 degrees C., and other processing conditions were the same as those in step A described above.

In this regard, when a film is formed on a wafer having a large surface area, most of the precursor gas supplied from the nozzle 249*a* does not flow a narrow gap between the wafers 200 (between the wafer pitches), but flow to the gap G region between the peripheral edge portions of the wafers 200 and the inner wall of the reaction tube 203. As a result, the precursor gas is diffused at the peripheral edge portions of the wafers, the total amount of the precursor gas flowing on the wafer is reduced, and the precursor gas reaching the central portions of the wafers is depleted. Further, the film formed on the peripheral edge portion of the wafer is thickened by the precursor gas flowing in the gap G region. As a result, the film is formed in a concave shape on the wafer.

When the $N_2$ gas supplied from the nozzle 249*c* is supplied toward the nozzle 249*a* in the direction facing the wall of the first protrusion 302 as in the present embodiment, as shown in FIG. 5B, a vortex flow of the inert gas ($N_2$ gas) is formed at a position overlapping with a part of the peripheral edge portion of the wafer 200 near the second protrusion 303. Due to the vortex flow of the inert gas, the precursor gas flowing in the gap G region is blocked near the second protrusion pressure 303, and the precursor gas can be prevented from flowing out to the gap G region on the downstream side of the nozzle 249*c*. In this way, the concentration of the precursor gas is reduced and diluted in a part of the peripheral edge portion of the wafer 200. As a result, the thickening of the film at the peripheral edge portion of the wafer 200 is suppressed.

Further, due to the vortex flow of the inert gas, the precursor gas blocked near the second protrusion 303 is guided toward the center of the wafer 200 without being mixed with the $N_2$ gas. The vortex flow of the inert gas and the precursor gas repel each other without being mixed, and the flow direction of the precursor gas is changed to the flow direction of the vortex flow of the inert gas. That is, the precursor gas is supplied to the central portion of the wafer 200, and the film is thickened in the central portion of the wafer 200.

Further, the $N_2$ gas supplied from the nozzle 249*c* flows through the gap G region on the downstream side toward the exhaust port 233 due to the vortex flow of the inert gas. Then, the $N_2$ gas is discharged. That is, the precursor gas in the gap G region on the downstream side of the second protrusion 303 is diluted with the $N_2$ gas, and the thickening of the film is suppressed in the peripheral edge portion of the wafer 200.

That is, the range of the dilution effect of the precursor gas on the wafer 200 can be adjusted by generating the vortex flow of the inert gas by supplying the inert gas through the nozzles 249*c* and 249*d*.

The magnitude of the vortex flow of the inert gas can be controlled by adjusting the positions of the nozzles 249*c* and 249*d*, the orientations of the gas supply holes 250*c* and 250*d* of the nozzles 249*c* and 249*d*, the wall surface shape of the reaction tube 203, or the flow rate of the inert gas supplied from the nozzles 249*c* and 249*d* to the total flow rate of the precursor gas. Therefore, it is possible to control the film thickness by the dilution in a region from the peripheral edge portion of the wafer to an arbitrary distance.

Therefore, it is possible to control the in-plane film thickness distribution, and it is possible to improve the in-plane film thickness uniformity even in the pattern wafer having a large surface area to be processed.

Hereinafter, examples will be described.

Example 1

Figure 6:
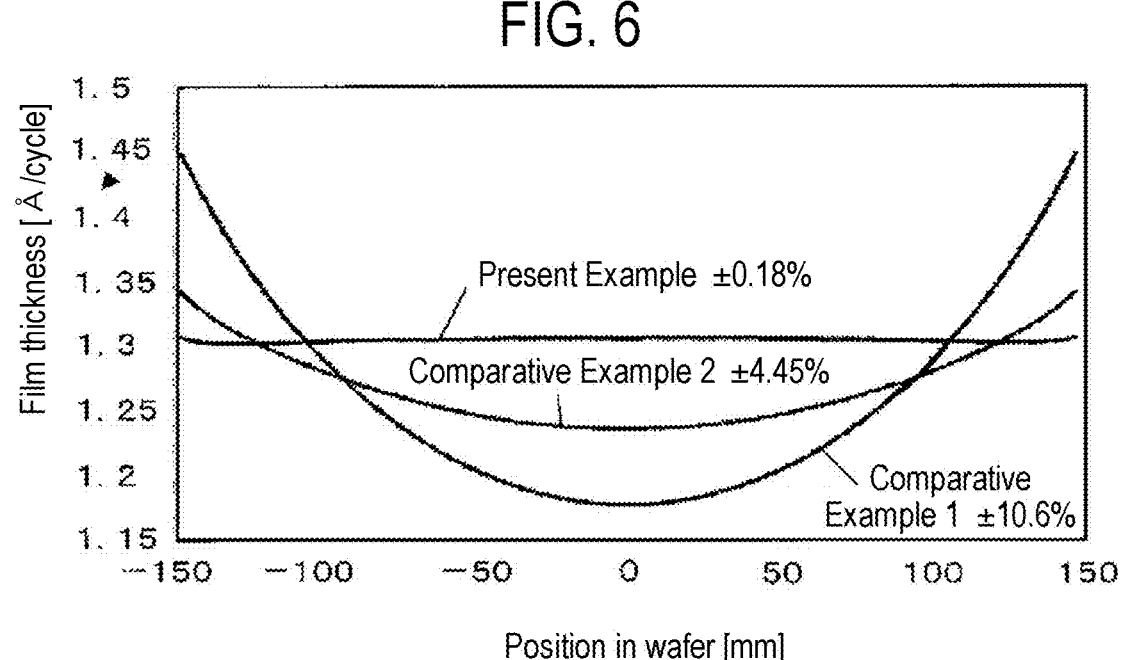
FIG. 6 is a diagram showing the analysis results of an in-plane film thickness distributions for the films formed on the substrates by using the substrate processing apparatus according to one embodiment of the present disclosure (Present Example), a substrate processing apparatus according to Comparative Example 1, and a substrate processing apparatus according to Comparative Example 2.

In the Present Example shown in FIG. 6, the in-plane film thickness uniformity for the wafer on which a SiN film is formed according to the film-forming sequence shown in FIG. 4 using the substrate processing apparatus shown in FIGS. 1 and 2 was evaluated. In Comparative Example 1 shown in FIG. 6, the in-plane film thickness uniformity for the wafer on which a SiN film is formed using a substrate processing apparatus not provided with a counter nozzle in the process chamber was evaluated. In Comparative Example 2 shown in FIG. 6, the in-plane film thickness uniformity for the wafer on which a SiN film is formed using a substrate processing apparatus having two counter nozzles in the process chamber was evaluated. In Comparative Example 2, the two counter nozzles are arranged at positions 900 spaced apart from the process gas nozzle in the circumferential direction of the wafer 200, and the gas supply holes of the respective counter nozzles face the center of the wafer 200.

The in-plane film thickness uniformity of the wafer formed by the Present Example was +0.18%, the in-plane film thickness uniformity of the wafer formed by Comparative Example 1 was +10.6%, and the in-plane film thickness uniformity of the wafer formed by Comparative Example 2 was +4.45%.

It was confirmed that in Comparative Example 1 provided with no counter nozzle, as compared with Comparative Example 2 and the present embodiment using a counter nozzle the film thickness in the peripheral edge portion (both ends) of the wafer is larger than the film thickness in the central portion of the wafer. Further, it was confirmed that when the counter nozzle according to the Present Embodiment is used, as compared with the case where the counter nozzle according to Comparative Example 2 is used, the thickening of the film in the peripheral edge portion (both ends) of the wafer 200 is suppressed and the in-plane film thickness uniformity is improved.

In Comparative Example 2, the $N_2$ gas supplied by the side counter nozzles is mixed with the precursor gas, and the dilution effect of the precursor in the peripheral edge portion of the wafer is diminished. In addition, as the precursor gas is diluted, the total amount of the precursor gas that reaches the central portion of the wafer is reduced. Furthermore, the precursor gas flows out to the gap G region on the downstream side, and the film is thickened in the peripheral edge portion due to the diffusion of the precursor gas. As a result, the in-plane film thickness distribution is concave.

On the other hand, in the Present Example, the vortex flow of the inert gas formed by the $N_2$ gas supplied by the side counter nozzles changes the flow of the precursor gas flowing through the gap G region without being mixed with the precursor gas. As a result, the concentration of the precursor gas flowing in the gap G region is reduced, and the thickening of the film in the peripheral edge portion of the wafer is suppressed. Further, due to the vortex flow of the inert gas, the precursor gas flowing in the gap G region is guided toward the center of the wafer, and the flow rate of the precursor gas reaching the center of the wafer is increased. In addition, due to the vortex flow of the inert gas, the precursor gas in the gap G region on the downstream side is diluted, and the thickening of the film in the peripheral edge portion of the wafer 200 is suppressed.

Therefore, it was confirmed that the in-plane film thickness uniformity is improved by allowing the gas supply holes of the counter nozzles to face a process gas nozzle side rather than a wafer center side.

Example 2

Figure 7A:
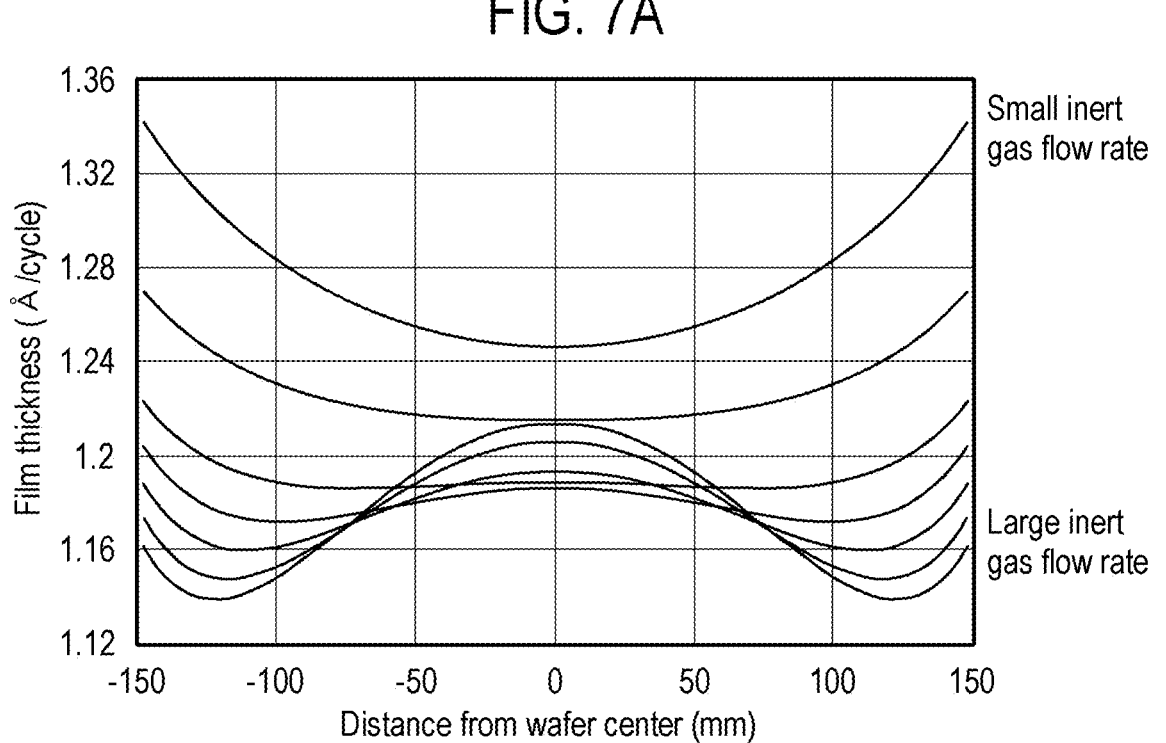
FIG. 7A is a diagram showing the relationship between the flow rate of the inert gas in the counter nozzle and the in-plane film thickness distribution when the film is formed on the substrate by using the substrate processing apparatus according to Comparative Example 2.

Next, a dependency of the film thickness on the flow rate of the inert gas in the counter nozzles was compared. FIG. 7A is a diagram showing a relationship between the flow rate of the inert gas supplied by the counter nozzles of Comparative Example 2 and the in-plane film thickness distribution, and FIG. 7B is a diagram showing a relationship between the flow rate of the inert gas supplied by the counter nozzles of the Present Example and the in-plane film thickness distribution.

As shown in FIG. 7A, in Comparative Example 2, if the flow rate of the $N_2$ gas supplied from the counter nozzles is small, the film thickness in the peripheral edge portion of the wafer is increased. Presumably, this is because the $N_2$ gas supplied from the counter nozzle cannot sufficiently dilute the precursor gas flowing through the gap G and the precursor gas cannot reach the central portion of the wafer. Further, it was confirmed that the film thickness in the peripheral edge portion of the wafer can be reduced by increasing the flow rate of the $N_2$ gas supplied from the counter nozzles, but the film is locally thickened in the immediate vicinity of the peripheral edge portion of the wafer. Presumably, this is because the precursor gas in the peripheral edge portion of the wafer is diluted by the $N_2$ gas supplied from the counter nozzles, but the concentration diffusion occurs in the immediate vicinity of the peripheral edge portion due to the concentration difference from the precursor gas flowing through the gap G. As described above, Comparative Example 2 is not effective for the local thickening of the film in the immediate vicinity of the peripheral edge portion. In this regard, the peripheral edge portion of the wafer refers to a portion where the distance from the center of the wafer is 80 mm or more and 120 mm or less, and the immediate vicinity of the peripheral edge portion of the wafer refers to a portion where the distance from the center of the wafer is 120 mm or more and 150 mm or less. It was confirmed that when the flow rate of the $N_2$ gas was further increased, the film is thickened in the central portion of the wafer. Presumably, this is because when the flow rate of the $N_2$ gas supplied from the counter nozzles is large, the $N_2$ gas is supplied toward the center of the wafer, so that the precursor gas is diluted in the peripheral edge portion of the wafer, but the precursor gas in the gap G largely flows to the central portion of the wafer due to the $N_2$ gas supplied from the counter nozzles.

Figure 7B:
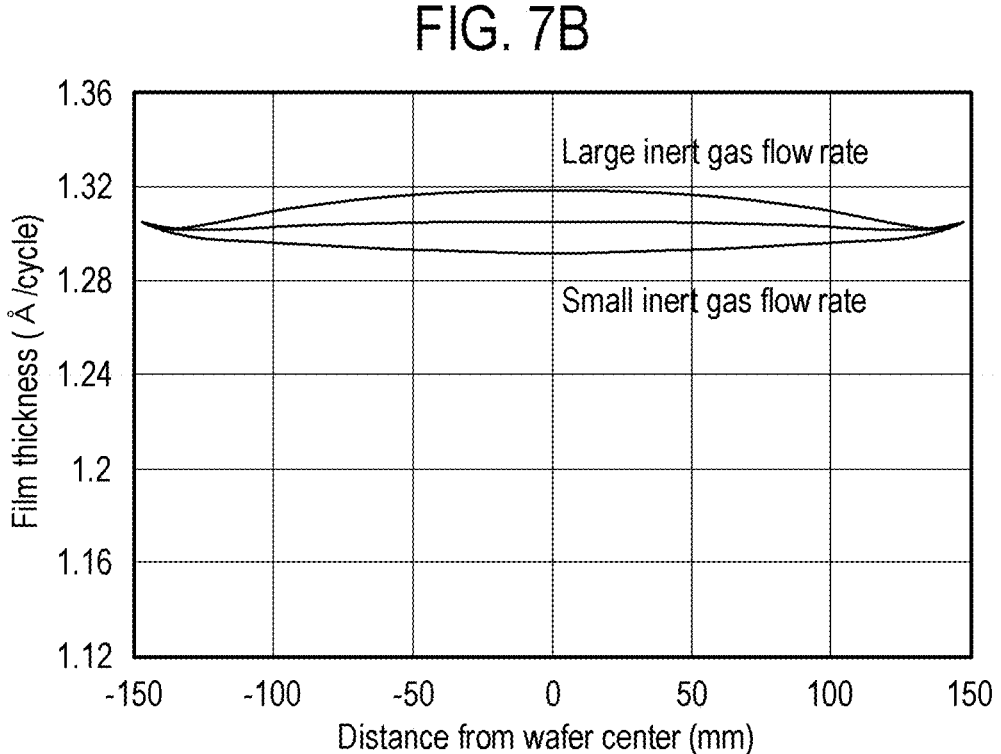
FIG. 7B is a diagram showing the relationship between the flow rate of the inert gas in the counter nozzle and the in-plane film thickness distribution when the film is formed on the substrate by using the substrate processing apparatus according to one embodiment of the present disclosure.

As shown in FIG. 7B, in the Present Example, it was confirmed that when the flow rate of the $N_2$ gas supplied from the counter nozzles is increased, the film is thickened in the central portion of the wafer while suppressing the local thickening of the film in the immediate vicinity of the peripheral edge portion of the wafer. As a result, in-plane unevenness can be controlled without causing the local thickening of the film in the wafer edge, and the in-plane film thickness distribution on the wafer does not become a W-shaped distribution. That is, it was confirmed that the in-plane film thickness distribution can be controlled and the in-plane film thickness uniformity can be improved by adjusting the flow rate of the inert gas supplied from the counter nozzles.

(4) Effect of the Present Embodiment

According to the present embodiment, one or more of the following effects can be obtained.

(a) When the process gas is supplied to the wafer from the process gas nozzle, the vortex flow of the inert gas is formed by supplying the inert gas to the process gas nozzle from the counter nozzle spaced apart by a predetermined distance from the process gas nozzle in the circumferential direction of the wafer. This makes it possible to improve the in-plane film thickness uniformity of the film formed on the wafer.

(b) Due to the vortex flow of the inert gas, the process gas flowing in the gap G region between the peripheral edge portion of the wafer and the inner wall of the reaction tube repels the inert gas without being mixed with the inert gas, and flows toward the center of the wafer as the flow direction of the process gas is changed by the vortex flow of the inert gas. Therefore, the amount of the precursor gas supplied to the center of the wafer can be increased, and the film can be thickened in the central portion of the wafer.

(c) Further, by forming the vortex flow of the inert gas near the second protrusion 303 and the third protrusion 304, it is possible to suppress the process gas from entry into the gap G region between the peripheral edge portion of the wafer and the inner wall of the reaction tube, reduces the process gas flowing to the gap G region on the downstream side of the second protrusion 303 and the third protrusion 304, and suppress the thickening of the film in the peripheral edge portion of the wafer.

(d) Further, by forming the vortex flow of the inert gas to overlap with a part of the peripheral edge portion of the wafer, the concentration of the precursor gas is reduced and diluted in a part of the peripheral edge portion of the wafer. As a result, it is possible to suppress a thickening of the film in the peripheral edge portion of the wafer.

(e) Further, due to the vortex flow of the inert gas near the second protrusion 303 and the third protrusion 304, the inert gas supplied by the counter nozzle is allowed to flow toward the exhaust port through the gap G region on the downstream side and is discharged from the exhaust port. Therefore, the process gas in the gap G region on the downstream side of the second protrusion 302 and the third protrusion 304 is diluted, and the thickening of the film in the peripheral edge portion of the wafer 200 is suppressed. As a result, the inert gas is supplied to the temperature sensor 263 provided in the gap G region on the downstream side of the process chamber 201, and the process gas is significantly reduced, thereby suppressing adhesion of the process gas to the temperature sensor 263. Since the contamination of the temperature sensor 263 by the adhesion of the process gas is suppressed, it is possible to prolong the maintenance cycle of the temperature sensor 263.

(f) By controlling the flow rate of the inert gas supplied by the counter nozzle to form the vortex flow of the inert gas, it is possible to adjust the dilution effect range of the process gas on the wafer 200.

(g) Further, by arranging two counter nozzles line-symmetrically to the straight line connecting the center of the process gas nozzle and the center of the exhaust port, it is possible to improve the in-plane film thickness uniformity of the film formed on the wafer.

(h) By adjusting the installation positions of the counter nozzles, the orientations of the gas supply holes formed in the counter nozzles, the flow rate of the inert gas supplied by the counter gas nozzles to the total flow rate of the process gas, and the like, it is possible to control the in-plane film thickness distribution on the wafer and improve the in-plane film thickness uniformity.

The embodiment of the present disclosure has been specifically described above. However, the present disclosure is not limited to the above-described embodiment, and various changes can be made without departing from the gist thereof.

In the above-described embodiment, there has been described the example in which two nozzles 249c and 249d are used as counter nozzles. However, the present disclosure is not limited thereto. The number of the counter nozzles may be one or more than two. If there is one counter nozzle, the film is thickened in the peripheral edge portion of the wafer on the side having no counter nozzle. Therefore, two or more counter nozzles are preferable.

Further, in the above-described embodiment, the example in which the SiN film is formed on the wafer 200 has been described as a substrate processing process. However, the present disclosure is not limited thereto. For example, the present disclosure may also be suitably applied to form, in addition to the SiN film, a film containing a silicon compound containing Si, or a film containing a metal compound such as tungsten (W), titanium (Ti) or hafnium (Hf).

Further, the above-described embodiment may be suitably applied to a film-forming process including, for example, CVD (Chemical Vapor Deposition), PVD (Physical Vapor Deposition), a process of forming an oxide film or a nitride film, and a process of forming a film containing a metal.

Further, it is preferable that the recipes used for the substrate processing process are individually prepared according to the processing contents and stored in the memory 121c via a telecommunication line or the external memory 123. Then, when starting the processing process, it is preferable that the CPU 121a appropriately selects an appropriate recipe from the plurality of recipes stored in the memory 121c according to the contents of the substrate processing process. This makes it possible for one substrate processing apparatus to form films having various film types, composition ratios, film qualities and film thicknesses with good reproducibility. In addition, the burden on the operator can be reduced, and the process can be started quickly while avoiding operation mistakes.

Further, the above-mentioned recipe is not limited to the newly created one and may be prepared, for example, by modifying the existing recipe already installed in the substrate processing apparatus. When changing the recipe, the changed recipe may be installed on the substrate processing apparatus via a telecommunication line or a recording medium on which the recipe is recorded. Further, the input/output device 122 included in the existing substrate processing apparatus may be operated to directly change the existing recipe already installed in the substrate processing apparatus.

Further, the present disclosure ion may be applied not only to a semiconductor manufacturing apparatus for processing a semiconductor wafer such as the above-described substrate processing apparatus, but also to an LCD (Liquid Crystal Display) manufacturing apparatus for processing a glass substrate.

According to the present disclosure, it is possible to provide a configuration capable of improving the in-plane film thickness uniformity of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a first nozzle configured to supply a process gas to a process chamber that processes a substrate; and
   a second nozzle configured to supply an inert gas to the process chamber, and
   wherein the inert gas supplied from the second nozzle is supplied at an angle directed away from the center of the wafer and toward the first nozzle to cause a flow direction of the process gas to be oriented toward a center of the substrate by forming a vortex flow of the inert gas to overlap with at least a part of a peripheral edge portion of the substrate.

2. The substrate processing apparatus of claim 1, further comprising:
   a reaction container defining the process chamber therein and including a first protrusion protruding outward to accommodate the first nozzle and a second protrusion protruding outward to accommodate the second nozzle, and
   wherein the inert gas supplied from the second nozzle is supplied toward the first nozzle to form the vortex flow of the inert gas in a vicinity of the second protrusion.

3. The substrate processing apparatus of claim 2, wherein the process gas supplied from the first nozzle and flowing between an end portion of the substrate and an inner wall of the reaction container flows toward a center of the substrate by the vortex flow of the inert gas.

4. The substrate processing apparatus of claim 2, further comprising:
   an exhauster configured to exhaust an atmosphere in the process chamber, and
   wherein the inert gas supplied from the second nozzle is caused to flow toward the exhauster between an end portion of the substrate and an inner wall of the reaction container by the vortex flow of the inert gas near the second protrusion.

5. The substrate processing apparatus of claim 4, wherein the inert gas supplied from the second nozzle is exhausted from the second nozzle toward the exhauster without flowing over the substrate.

6. The substrate processing apparatus of claim 2, wherein the reaction container further comprises a third protrusion protruding outward to accommodate an inert gas nozzle.

7. The substrate processing apparatus of claim 6, further comprising:
   an exhauster configured to exhaust an atmosphere in the process chamber, and
   wherein the second nozzle accommodated by the second protrusion and the inert gas nozzle accommodated by the third protrusion are arranged line-symmetrically to a straight line connecting the first nozzle and the exhauster.

8. The substrate processing apparatus of claim 6, wherein the second nozzle and the inert gas nozzle include gas supply holes, respectively, and
   each of the gas supply holes is formed to face toward the first protrusion.

9. The substrate processing apparatus of claim 8, wherein each of the second nozzle and the inert gas nozzle is configured to form a vortex flow at the peripheral edge portion of the substrate by suppling the inert gas.

10. The substrate processing apparatus of claim 2, wherein the vortex flow of the inert gas and the process gas repel each other without being mixed, and the flow direction of the process gas is changed to a flow direction of the vortex flow of the inert gas.

11. The substrate processing apparatus of claim 2, wherein the second nozzle includes a gas supply hole configured to supply the inert gas, and the gas supply hole is formed to face toward the first protrusion.

12. The substrate processing apparatus of claim 2, wherein the vortex flow of the inert gas is controlled based on at least one selected from the group of a position of the second nozzle, an orientation of a gas supply hole of the second nozzle, a wall surface shape of the reaction container, and a flow rate of the inert gas supplied from the second nozzle relative to a total flow rate of the process gas.

13. The substrate processing apparatus of claim 1, wherein the second nozzle is arranged to be spaced apart by a predetermined distance from the first nozzle in a circumferential direction of the substrate.

14. The substrate processing apparatus of claim 1, wherein a concentration of the process gas is reduced at the part of the peripheral edge portion of the substrate at which the vortex flow of the inert gas is formed.

15. The substrate processing apparatus of claim 1, wherein the second nozzle is arranged at a position of 15 degrees or more and 120 degrees or less from a straight line connecting a center of the first nozzle and a center of the substrate in the circumferential direction of the substrate.

16. The substrate processing apparatus of claim 1, wherein a flow rate of the inert gas supplied from the second nozzle is ¼ or more and ⅔ or less of a total flow rate of the process gas supplied from the first nozzle.

17. The substrate processing apparatus of claim 1, wherein the part of the peripheral edge portion includes the peripheral edge portion of the substrate and an immediate vicinity of the peripheral edge portion of the substrate.

18. The substrate processing apparatus of claim 17, wherein the peripheral edge portion is in a distance of 80 mm or more and 120 mm or less from the center of the substrate, and the immediate vicinity of the peripheral edge portion of the substrate is in a distance of 120 mm or more and 150 mm or less from the center of the substrate.

19. A method of manufacturing a semiconductor device, comprising:

loading a substrate into a process chamber that processes the substrate; and processing the substrate by supplying a process gas from a first nozzle to the process chamber, and wherein in the act of processing the substrate, an inert gas is supplied from a second nozzle and at an angle directed away from the center of the wafer and toward the first nozzle to cause a flow direction of the process gas to be oriented toward a center of the substrate by forming a vortex flow of the inert gas to overlap with at least a part of a peripheral edge portion of the substrate.

20. A non-transitory computer-readable recording medium storing a program that causes, by a computer, a substrate processing apparatus to perform a process comprising:

loading a substrate into a process chamber of the substrate processing apparatus; and processing the substrate by supplying a process gas from a first nozzle to the process chamber, and wherein in the act of processing the substrate, an inert gas is supplied from a second nozzle and at an angle directed away from the center of the wafer and toward the first nozzle to cause a flow direction of the process gas to be oriented toward a center of the substrate by forming a vortex flow of the inert gas to overlap with at least a part of a peripheral edge portion of the substrate.

* * * * *